United States Patent
Kang et al.

(10) Patent No.: US 7,463,526 B2
(45) Date of Patent: Dec. 9, 2008

(54) PROGRAMMING METHOD FOR FLASH MEMORY CAPABLE OF COMPENSATING REDUCTION OF READ MARGIN BETWEEN STATES DUE TO HIGH TEMPERATURE STRESS

(75) Inventors: Dong-Ku Kang, Seongnam-si (KR); Young-Ho Lim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 19 days.

(21) Appl. No.: 11/513,159

(22) Filed: Aug. 31, 2006

(65) Prior Publication Data

US 2007/0159892 A1    Jul. 12, 2007

(30) Foreign Application Priority Data

Jan. 12, 2006    (KR) ...................... 10-2006-0003587

(51) Int. Cl.
G11C 11/34    (2006.01)
(52) U.S. Cl. ............................. 365/185.22; 365/185.28; 365/185.24
(58) Field of Classification Search ............. 365/185.22
See application file for complete search history.

(56) References Cited

U.S. PATENT DOCUMENTS

2005/0105337 A1*    5/2005    Cohen et al. ........... 365/185.18

FOREIGN PATENT DOCUMENTS

| JP | 10214492 | 8/1998 |
|---|---|---|
| JP | 2000222893 | 8/2000 |
| KR | 1020050018943 A | 2/2005 |
| KR | 1020060107689 A | 10/2006 |
| WO | 2004006266 A1 | 1/2004 |

* cited by examiner

*Primary Examiner*—Hoai V. Ho
*Assistant Examiner*—Jason Lappas
(74) *Attorney, Agent, or Firm*—Volentine & Whitt, PLLC (57) ABSTRACT

A programming method of a flash memory device having a plurality of memory cells for storing multi-bit data indicating one of a plurality of states. The programming method includes programming selected memory cells using multi-bit data to have one of the states; detecting programmed memory cells arranged within a predetermined region of threshold voltage distribution each corresponding to at least two of the states, wherein predetermined regions of the respective at least two states are selected by one of a first verify voltage and a read voltage and a second verify voltage, the first verify voltage being lower than the second verify voltage and higher than the read voltage; and simultaneously programming detected memory cells of the at least two states to have a threshold voltage being equivalent to or higher than the second verify voltage corresponding to each of the states.

19 Claims, 11 Drawing Sheets

Programmed Memory Cell        Memory Cell To Be Programmed

PROGRAMMING METHOD FOR FLASH MEMORY CAPABLE OF COMPENSATING REDUCTION OF READ MARGIN BETWEEN STATES DUE TO HIGH TEMPERATURE STRESS

BACKGROUND OF THE INVENTION

1. Field of the Invention

Embodiments of the invention relate to a flash memory device and, more particularly, to a programming method adapted for use with a flash memory device.

This application claims priority under 35 U.S.C § 119 to Korean Patent Application 2006-03587 filed on Jan. 12, 2006, the subject matter of which is hereby incorporated by reference.

2. Description of the Related Art

In recent years, volatile and non-volatile memory devices have been incorporated into a host of mobile appliances, such as MP3 players, cellular telephones, portable multimedia players (PMPs), notebook computers, personal digital assistances (PDAs), etc., in ever greater quantities. Emerging mobile appliances require large quantities of digital data storage to support functionality, such as motion picture playback, etc.

Great effort has been expended to meet the demand for ever expanding memory in mobile appliances. One result of this effort is the development of multi-bit memory devices capable of storing greater than a single (1) bit (e.g., a logical "1" or "0") of data per memory cell. Exemplary multi-bit memory devices are disclosed, for example, in U.S. Pat. No. 6,122,188; U.S. Pat. No. 6,075,734; and U.S. Pat. No. 5,923,587, the subject matter of which is hereby incorporated by reference.

When 1-bit data is stored in a memory cell, the memory cell will exhibit one of two possible threshold voltage distributions, i.e., the memory cell will be programmed (or written) to have one of two data states corresponding to a logical "0" or "1". Each threshold voltage corresponding to a data state actually appears within an expected voltage distribution—hence the term "threshold voltage distribution". On the other hand, when 2-bit data is stored in a memory cell, the memory cell will exhibit one of four threshold voltages (i.e., one distribution amongst four possible threshold voltage distributions). These threshold voltages distributions correspond to four (4) logic data states "11", "10", "00", and "01". Threshold voltage distributions corresponding to four states (ST0, ST1, ST2, and ST3) are illustrated in FIG. (FIG.) 1.

Ideally, threshold voltage distributions corresponding to four data states should be carefully controlled such that each threshold voltage distribution exists within a predetermined range or "window." In order to achieve this goal, one conventional programming method uses an increment step pulse programming (ISPP) scheme. In the ISPP scheme, a threshold voltage shifts by a defined increment of programming voltage in accordance with the repetitive application of one or more programming loops. By setting the programming voltage increment to a small value, threshold voltage distributions may be minutely controlled to secure adequate voltage discrimination margin between respective data states. Unfortunately, the ISSP and similar schemes significantly increase the time required to program a memory cell to a desired data state, particularly for small increment sizes. Accordingly, the size of the program voltage increment will be defined in relation to maximum programming time parameters for a particular memory device.

The application of the ISPP or similar scheme notwithstanding, the corresponding threshold voltage distribution for each data state may be wider than a desired window due to various causes. For example, as indicated by dotted lines 10, 11, 12, and 13 in FIG. 1, respective threshold voltage distributions may expand due to coupling effects between adjacent memory cells during a programming operation. Such a coupling is referred to as "electric field coupling" or "F-poly coupling".

Figure 2:
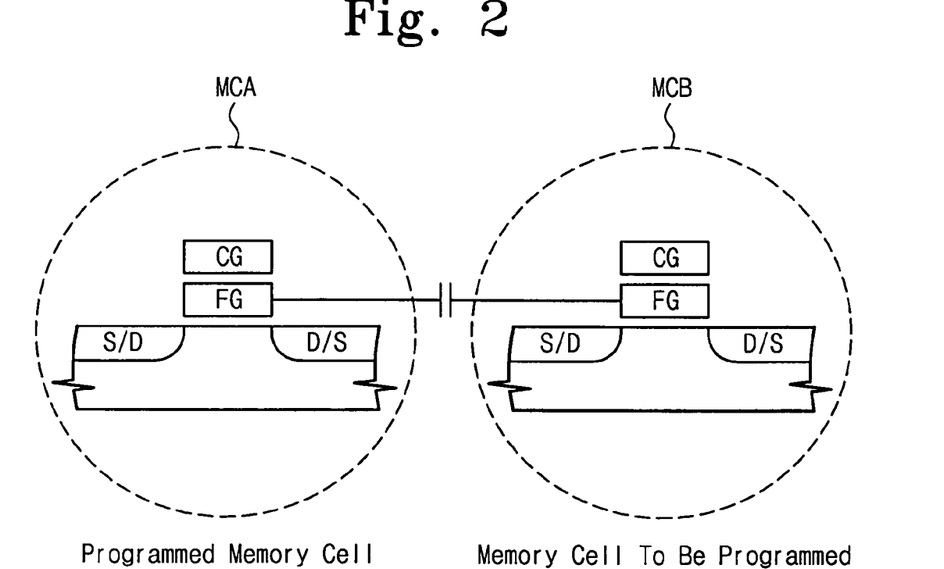
FIG. 2 illustrates the electric field and/or F-poly coupling effects generated between adjacent memory cells.

For example, as illustrated in FIG. 2, assuming that a first memory cell (MCA) and a second memory cell (MCB) are being programmed to have, respectively, any on one of four states, electrical charge accumulates on the floating gate (FG) of memory cell MCB as it is programmed. In turn, a voltage apparent on the floating gate of adjacent memory cell MCA rises due to coupling between the adjacent floating gates of memory cells MCA and MCB. Worse yet, the raised threshold voltage now apparent on the floating gate of memory cell MCA is retained due to the coupling between adjacent floating gates even after programming of memory cell MCB is completed. In this example, memory cell MCB is indicative of memory cells arranged in a wordline direction and/or a bitline direction relative to memory cell MCA.

Figure 1:
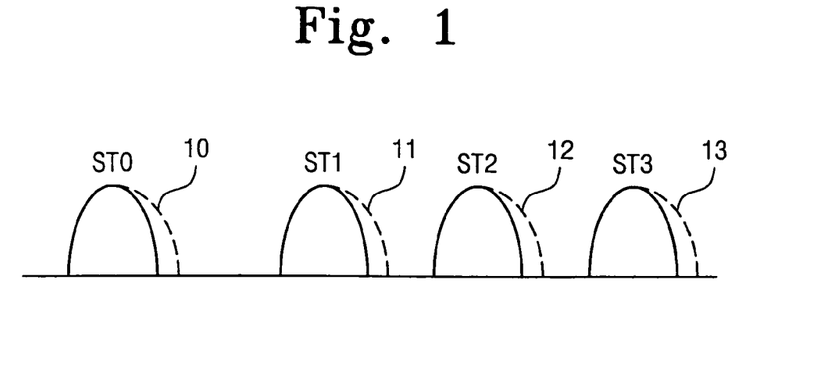
FIG. 1 illustrates expanded threshold voltage distributions due to electric field and/or F-poly coupling effects

Due to foregoing coupling effects, the ideal threshold voltages for programmed memory cell MCA expand as indicated by the dotted lines 10, 11, 12, and 12 of FIG. 1. Accordingly, the data state discrimination margin (i.e., the "read margin") between states is reduced.

One conventional technique adapted to preventing the expansion of threshold voltage distributions due to coupling effects is disclosed, for example, in U.S. Pat. No. 5,867,429, the subject matter of which is hereby incorporated by reference.

In addition to the foregoing electric field and/or F-poly coupling effects, the read margin between memory cell states may be further reduced as memory cell threshold voltages tend to drop over time. This phenomenon has been conventionally examined and is referred to as "hot temperature stress (HTS)". Under the influence of HTS, charge accumulated on the floating gate of a memory cell drains away into the substrate of the memory device. As accumulated charge on the floating gate is thus reduced, the threshold voltage distributions for the memory cell expand in the direction indicated by dotted lines 20, 21, and 22 of FIG. 3.

Accordingly, the expansion of threshold voltage distributions due to an electric field and/or F-poly coupling effects and HTS present a doubly difficult problem to memory system designers seeking to maintain read margins between memory cell data states. And this problem has only been exacerbated by recent commercial trends toward more complex semiconductor fabricating processes and more densely integrated semiconductor devices.

Accordingly, there exists a requirement to secure additional read margin between memory cell data states (e.g., the corresponding voltage distributions) by controlling for or mitigating the effects of electric field and/or F-poly coupling as well as HTS.

SUMMARY OF THE INVENTION

In one embodiment, the invention provides a programming method for a flash memory device having a plurality of memory cells storing multi-bit data indicating one of a plurality of states, the programming method comprising; programming selected memory cells with multi-bit data to have one of the plurality of states, detecting programmed memory cells arranged within a predetermined region of a threshold voltage distribution, the region corresponding to at least two of the plurality of states, wherein predetermined regions of the respective at least two of the plurality of states are selected by one of a first verify voltage and a read voltage and a second verify voltage, the first verify voltage being lower than the second verify voltage and higher than the read voltage, and simultaneously programming detected memory cells of the at least two of the plurality of states to have a threshold voltage being equivalent to or higher than the second verify voltage corresponding to each of the plurality of states.

In another embodiment, the invention provides a programming method for a flash memory device having a plurality of memory cells storing multi-bit data indicating one of at least four data states, the programming method comprising; programming selected memory cells using multi-bit data to have one of second through fourth states, detecting programmed memory cells arranged within a predetermined region of a threshold voltage distribution corresponding to the second state, wherein the predetermined region of the second state is selected by one of a first verify voltage and a first read voltage and a second verify voltage, the first verify voltage being lower than the second verify voltage and higher than the first read voltage, detecting programmed memory cells arranged within a predetermined region of a threshold voltage distribution corresponding to the third state, wherein the predetermined region of the third state is selected by one of a third verify voltage and a second read voltage and a fourth verify voltage, the third verify voltage being lower than the fourth verify voltage and higher than the second read voltage, and simultaneously programming the detected memory cells of the second state and the detected memory cells of the third state to have a threshold voltage being equivalent to or higher than the second and fourth verify voltage each corresponding to the second and third states.

In another embodiment, the invention provides a programming method for a flash memory device having a plurality of memory cells for storing multi-bit data indicating one of first through fourth data states, the programming method comprising; programming selected memory cells using multi-bit data to have one of the second through fourth states, detecting programmed memory cells arranged within a predetermined region of a threshold voltage corresponding to the second state, wherein the predetermined region of the second state is selected by one of a first verify voltage and a first read voltage and a second verify voltage, the first verify voltage being lower than the second verify voltage and higher than the first read voltage, detecting programmed memory cells arranged within a predetermined region of a threshold voltage distribution corresponding to the third state, wherein the predetermined region of the third state is selected by one of a third verify voltage and a second read voltage and a fourth verify voltage, the third verify voltage being lower than the third verify voltage and higher than the second read voltage, detecting programmed memory cells arranged within a predetermined region of a threshold voltage corresponding to the fourth state, wherein the predetermined region of the fourth state is selected by one of a fifth verify voltage and a third read voltage and a sixth verify voltage, the fifth verify voltage being lower than the sixth verify voltage and higher than the third read voltage, and simultaneously programming the detected memory cells of the second state, the detected memory cells of the third state, and the detected memory cells of the fourth state to have a threshold voltage being equivalent to or higher than the second, fourth, and sixth verify voltages each corresponding to the second, third, and fourth states.

DESCRIPTION OF EMBODIMENTS

The present invention will now be described in some additional detail with reference to the accompanying drawings. This invention may, however, be embodied in many different forms and should not be construed as being limited to only the embodiments set forth herein. Rather, these embodiments are presented as teaching examples. In the drawings, like numbers refer to like or similar elements.

Figure 4:
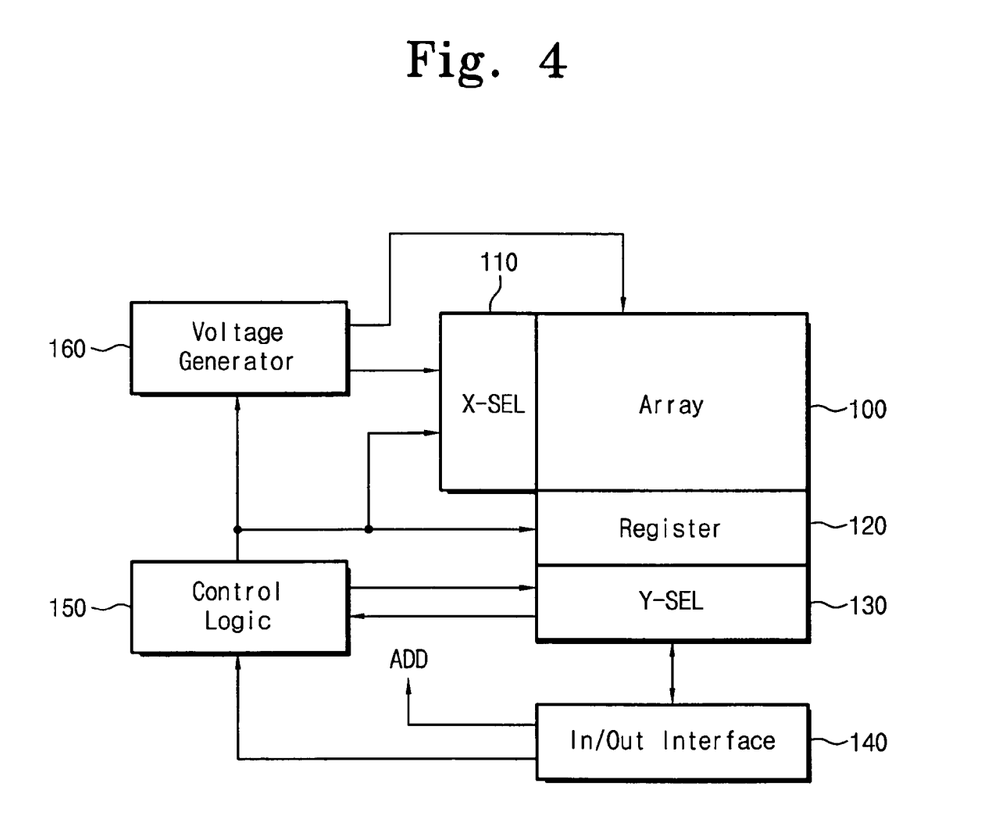
FIG. 4 is a block diagram of an exemplary flash memory device according to an embodiment of the invention.
Figure 5:
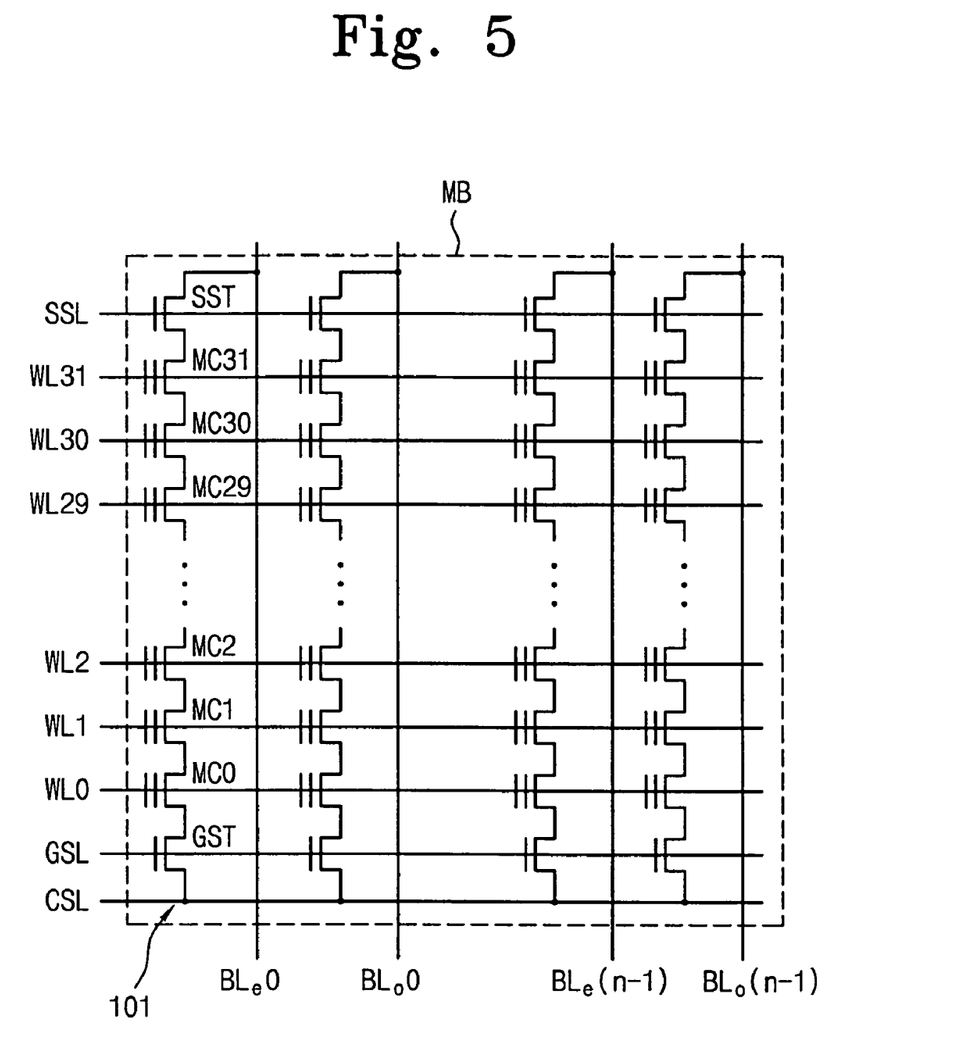
FIG. 5 is a circuit diagram further illustrating the memory cell array of FIG. 4.

FIG. 4 is a block diagram of a flash memory device according to an embodiment of the invention. FIG. 5 is a circuit diagram further illustrating the memory cell array of FIG. 4.

Referring to FIG. 4, the illustrated flash memory device includes a memory cell array 100 adapted to store data. Memory cell array 100 includes a plurality of memory blocks each having a memory cell configuration illustrated in FIG. 5.

As illustrated in FIG. 5, a memory block MB includes a plurality of memory cell strings 101 each having a string select transistor SST, a ground select transistor GST, and a plurality of memory cells (e.g., MC31-MC0). String selection transistor SST is controlled by a string select line SSL and has a drain connected to a corresponding bitline. Memory cells MC31-MC0 are serially coupled between the source of string select transistor SST and the drain of ground select transistor GST and are respectively controlled by corresponding wordlines WL31-WL0. It will be understood by those skilled in the art that the number of wordlines illustrated in FIG. 5 is merely exemplary. Each memory cell comprises of a floating gate transistor.

Returning to FIG. 4, a row selector circuit (X-SEL) 100 is controlled by a control logic 150. Row selector circuit 100 selects one of the plurality of memory blocks in response to an address (ADD) provided through an input/output interface (I/O interface) 140 and controls rows (including wordlines and select lines) of the selected memory block. A register block 120 is also controlled by control logic 150 and functions as a sense amplifier or a write driver according to the present operational mode (e.g., read/program). Although not illustrated in FIG. 4, register block 120 comprises a number of page buffers, as is conventionally understood. Each page buffer is electrically connected to one bitline or one of a pair of bitlines and either reads data from a memory cell, or stores data in the memory cell through a bitline. A column selector circuit (Y-SEL) 130 is controlled by control logic 150 and outputs data stored in register block 120 to I/O interface 140 or control logic 150 in response to the address ADD provided through I/O interface 140. For example, in a normal read operation, column selector circuit 130 outputs data stored in register block 120 to I/O interface 140. In a verify normal read operation, column selector circuit 130 outputs data stored in register block 120 to control logic 150 and control logic 150 determines whether the data provided from column selector circuit 130 is "pass" data.

During a data loading period of a programming operation, column selector circuit 130 outputs program data transferred through I/O interface 140 to register block 120. Control logic 150 is configured to control general operations of a flash memory device. A voltage generator 160 is also controlled by control logic 150 and configured to generate voltages (e.g., a wordline voltage, a bulk voltage, a read voltage, a pass voltage, etc.) required for program/erase/read operations.

As described below, a flash memory device according to an embodiment of the invention incorporates a novel programming approach adapted to secure additional read margin between memory cell data states even under conditions where constituent memory cells are subjected to electric field and/or F-poly coupling effects and HTS. According to a programming operation consistent with one embodiment of the invention, 2-bit data is stored in respective memory cells of a selected page so that memory cells are programmed using target threshold voltages of respective desired states. This method step will hereinafter be generally referred to as a "first programming operation". After the first programming operation is completed, read operations are executed to detect memory cells arranged within a predetermined threshold voltage region among the memory cells of the respective states. The detected memory cells are programmed to have a higher threshold voltage than target threshold voltages of the respective states. This method step will hereinafter be generally referred to as a "second programming operation".

The first programming operation for storing 2-bit data will vary with the configuration of register block 120. For example, after loading both LSB and MSB data bits into register block 120, the first programming operation may be executed. Alternatively, programming MSB data bit (hereinafter generally referred to as the "MSB programming operation") may be followed by programming LSB data bit (hereinafter generally referred to as the "LSB programming operation"). This latter operation is hereafter presented as an exemplary programming method, and be described in some additional detail with reference to FIGS. 6A and 6B.

One memory cell is programmed to have one of "11", "10", "00", and "01" states. For convenience of description, only, it is assumed that the "11", "10", "00", and "01" states correspond to ST0, ST1, ST2, and ST3, respectively. A memory cell having the "11" state is an erased memory cell, and a threshold voltage of a memory cell having the "10" state is higher than that of a memory cell having the "11" state. A threshold voltage of a memory cell having the "00" state is higher than that of a memory cell having the "10" state. Further, a threshold voltage of a memory cell having the "01" state is higher than that of a memory cell having the "00" state.

Figure 6A:
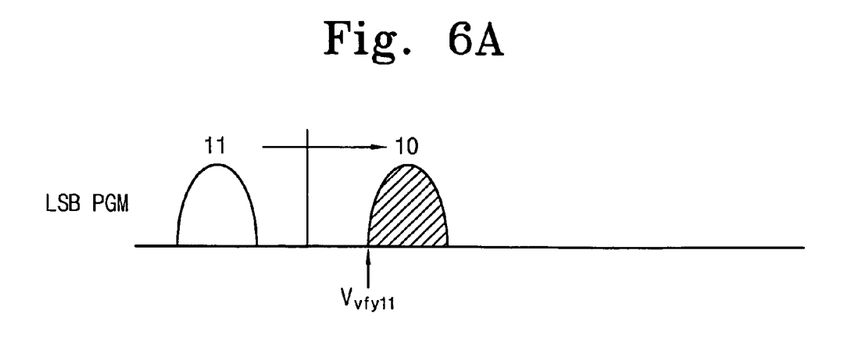
FIG. 6A and FIG. 6B illustrate a multi-bit programming operation according an embodiment of the invention.
Figure 6B:
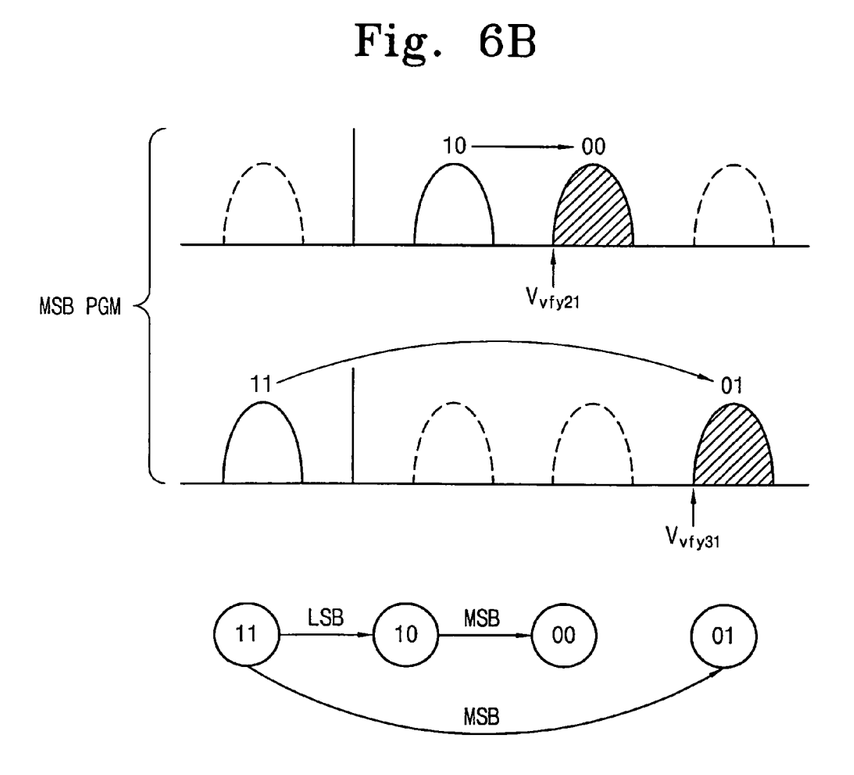

If an LSB programming operation is executed under the foregoing assumptions, a memory cell having an erased state or a "10" state is illustrated in FIG. 6A. If an MSB programming operation is executed following the LSB programming operation, a memory cell having the "11" state has an erased state or a "01" state while a memory cell having the "10" state has a "10" or "00" state, as illustrated in FIG. 6B.

Figure 7:
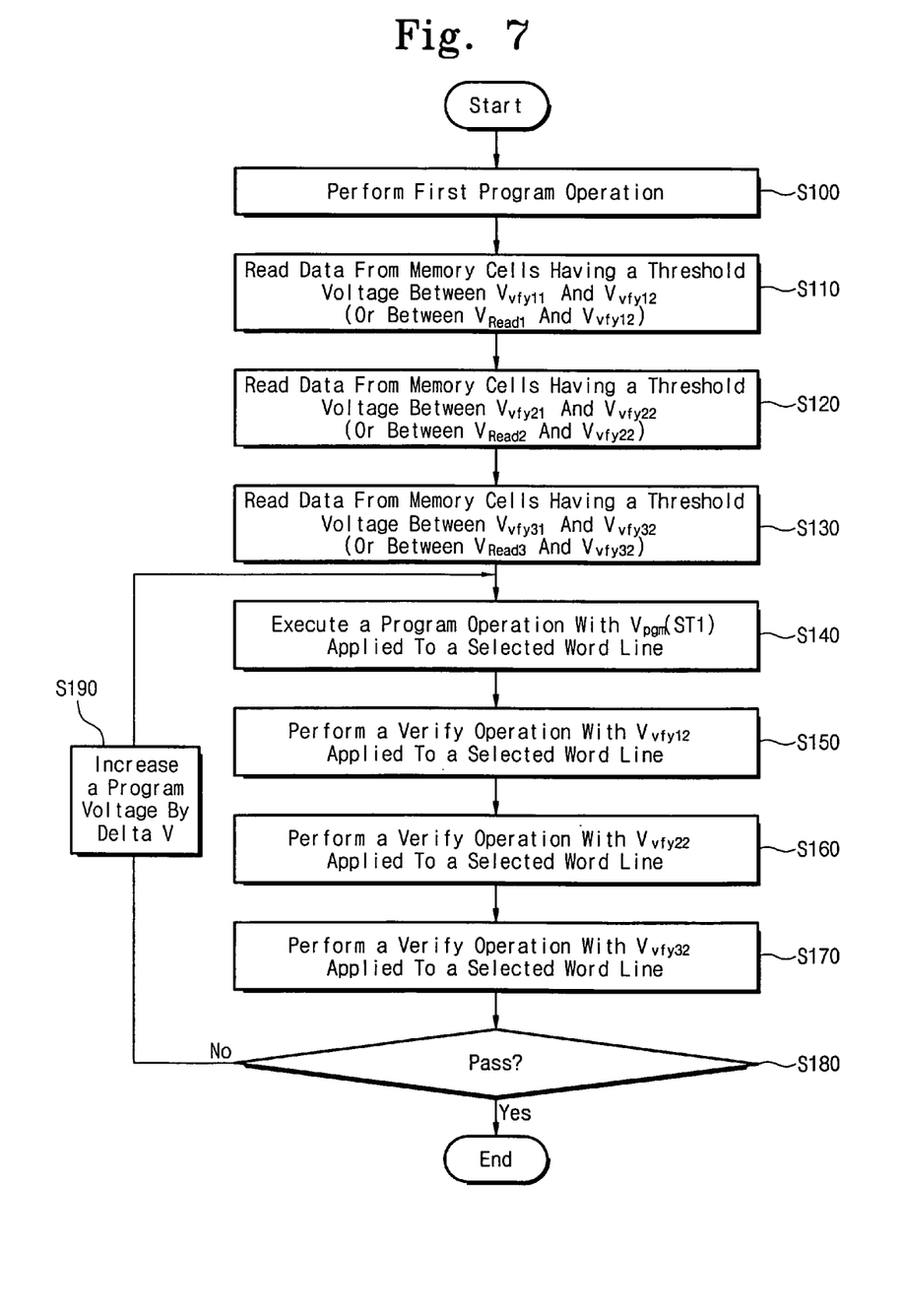
FIG. 7 is a flowchart illustrating a programming method for a flash memory device according to an embodiment of the invention.
Figure 8:
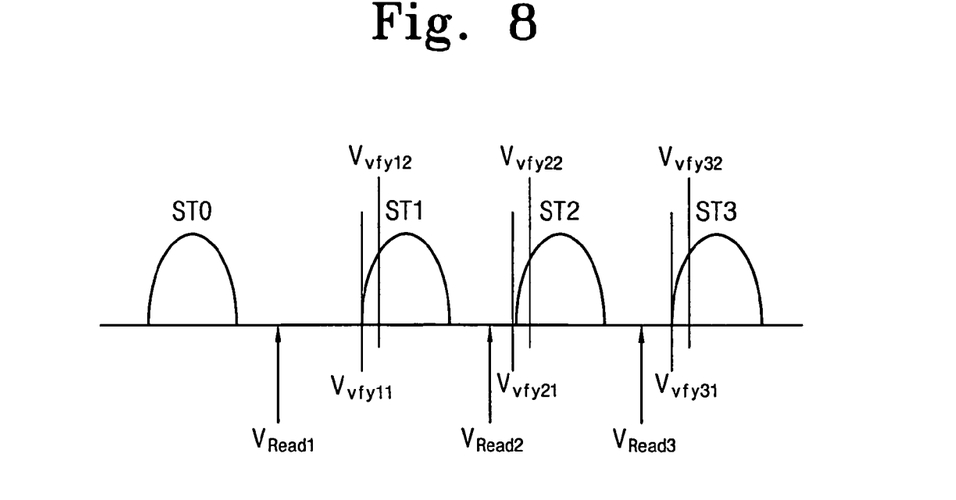
FIG. 8 illustrates verify voltages adapted for use in the execution of a programming operation for a flash memory device according to an embodiment of the invention.

FIG. 7 is a flowchart illustrating an exemplary programming method for a flash memory device according to an embodiment of the invention. FIG. 8 illustrates verify voltages adapted for use when executing a programming operation for a flash memory device according to an embodiment of the invention.

For purposes of this illustration, a first programming operation is assumed to be executed according to the programming method described with reference to FIG. 6A and FIG. 6B (S100). While the first programming operation is executed, memory cells of a selected page are programmed to one of states ST1, ST2, and ST3, as shown in FIG. 8. Using verify voltages Vvfy11, Vvfy21, and Vvfy31 corresponding to the states ST1, ST2, and ST3, it is determined whether they are programmed to the respective states. (See, FIG. 8). For example, using the verify voltage Vvfy11, it is determined whether a memory cell is programmed to the ST1 state; using the verify voltage Vvfy21, it is determined whether a memory cell is programmed to the ST2 state; and using the verify voltage Vvfy31, it is determined whether a memory cell is programmed to the ST3 state.

Once the first programming operation for 2-bit data is completed, the threshold voltage for selected memory cells will be arranged within a specific region among threshold voltage distributions corresponding to states ST1, ST2, and ST3. In the illustrated embodiment, the read operation is successively executed three times to detect memory cells arranged within a specific region of threshold voltage distributions, each corresponding to the states ST1, ST2, and ST3. For example, data is read from memory cells having a threshold voltage between verify voltages Vvfy11 and Vvfy12 (or a read voltage Vread1 and the verify voltage Vvfy12), as shown in FIG. 8 (S110). This may be done by executing a read operation through register block 120 while the verify voltage Vvfy11 (or the read voltage Vread1) is applied to a selected wordline and executing a read operation through register block 120 while the verify voltage Vvfy12 is applied to a selected wordline.

Next, data is read from memory cells having a threshold voltage between verify voltages Vvfy21 and Vvfy22 (or a read voltage Vread2 and the verify voltage Vvfy22), as shown in FIG. 8 (S120). This may be done by executing a read operation through register block 120 while the verify voltage Vvfy21 (or the read voltage Vread2) is applied to a selected wordline and executing a read operation through register block 120 while the verify voltage Vvfy22 is applied to a selected wordline.

Lastly, data is read from memory cells having a threshold voltage between verify voltages Vvfy31 and Vvfy32 (or a read voltage Vread3 and the verify voltage Vvfy32), as shown in FIG. 8 (S130). This may be done by executing a read operation through register block 120 while the verify voltage Vvfy31 (or the read voltage Vread3) is applied to a selected wordline and executing a read operation through register block 120 while the verify voltage Vvfy32 is applied to a selected wordline. It will be understood by those skilled in the art that method of detecting memory cells having threshold voltages between various verify voltages corresponding to respective states may vary with particular configurations of register block 120.

Figure 10:
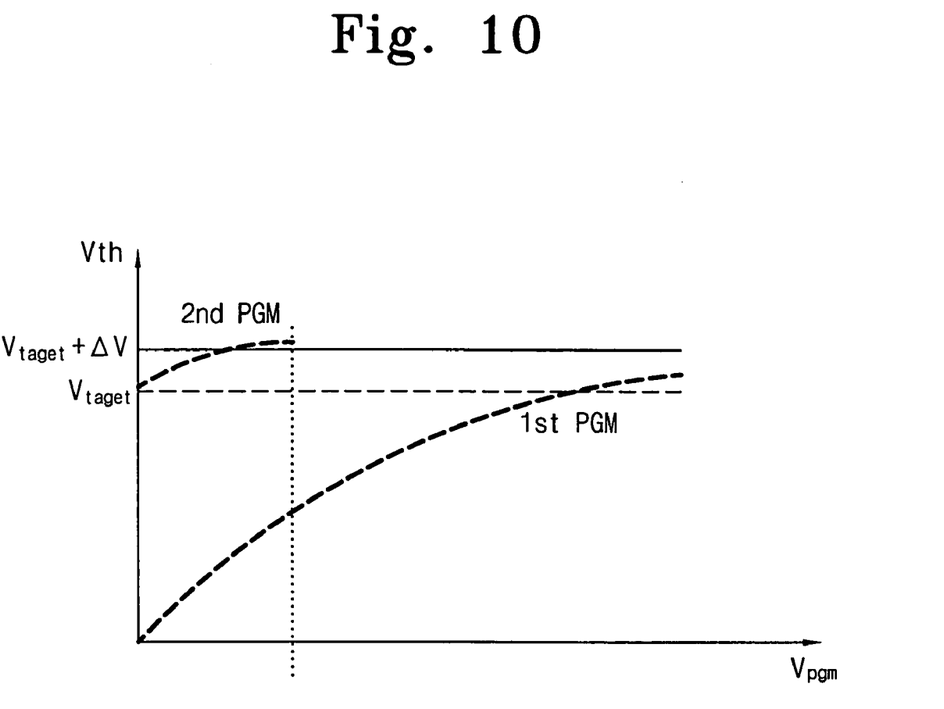
FIG. 10 illustrates possible fluctuations in threshold voltage during a primary programming operation and a secondary programming operation.

If memory cells having threshold voltages existing in a specific region of threshold voltage distributions each corresponding to respective states are detected, another programming operation (i.e., a secondary programming operation) is performed simultaneously for the detected memory cells (S140). At this point, a program voltage is applied to a wordline when a state ST1 is to be programmed. Although a low program voltage is applied to the selected wordline, threshold voltages of the detected memory cells increase with the increase of the program voltage during the secondary programming operation, as illustrated in FIG. 10. That is, although a low program voltage is applied to a selected wordline, charge is injected to the floating gate of a memory cell.

After the programming operation is completed, verify read operations are successively executed to determine whether the detected memory cells of the respective states are programmed with corresponding verify voltages or a voltage higher than the verify voltages. More specifically, a verify read operation is executed through register block 120 while a verify voltage Vvfyl2, acting as a read voltage, is applied to a selected wordline (S150). Next, a verify read operation is executed through register block 120 while a verify voltage Vvfy22, acting as a read voltage, is applied to a selected wordline (S160). Lastly, a verify read operation is executed through register block 120 while a verify voltage Vvfy32, acting as a read voltage, is applied to a selected wordline (S170).

Thereafter, it is determined whether the detected memory cells are correctly programmed (S180). If the determination result indicates that the detected memory cells are not all programmed with a required threshold voltage, a program voltage to be applied to a selected wordline and is increased by a predetermined increment (S190). The exemplary programming operation then returns to step S140 above. The programming loop comprising steps S140-S170 is repeated for a predetermined number of iterations or until the detected memory cells are all properly programmed.

Figure 9:
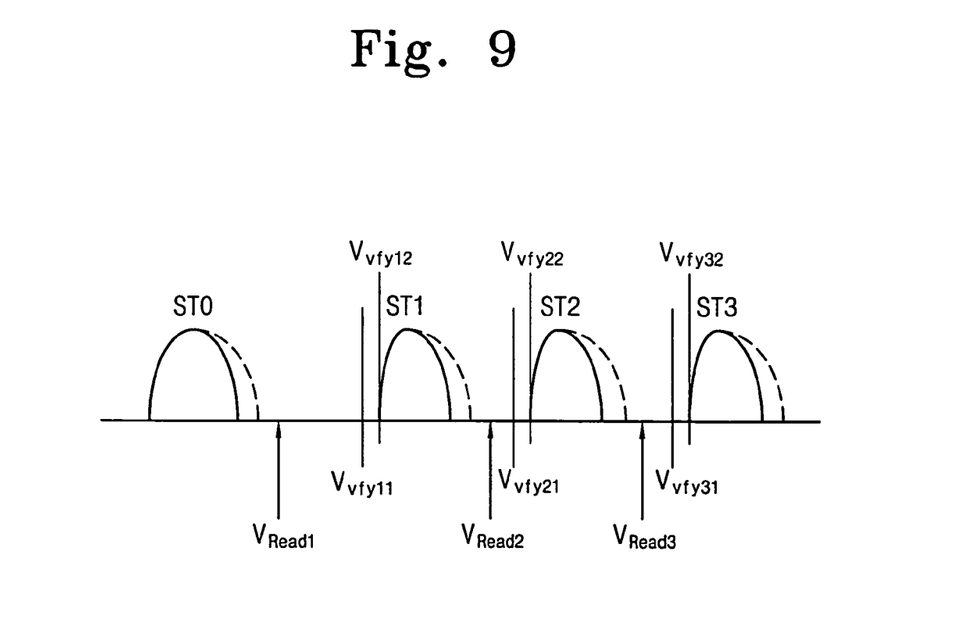
FIG. 9 illustrates exemplary threshold voltage distributions derived after execution of a programming operation for a flash memory device according to an embodiment of the invention.

Referring to FIG. 9, for a threshold voltage distribution corresponding to state ST1, memory cells between verify voltages Vvfy11 and Vvfy12 (or a read voltage Vread1 and the verify voltage Vvfy12) are programmed to have the verify voltage Vvfy12 or a voltage higher than the verify voltage Vvfy12. As can be seen by comparing FIG. 9 with FIG. 3, read margin between data states ST0 and ST1 is increased accordingly. For a threshold voltage corresponding to state ST2, verify voltages Vvfy21 and Vvfy22 (or a read voltage Vread2 and the verify voltage Vvfy22) are programmed to have the verify voltage Vvfy22 or a voltage higher than the verify voltage Vvfy22. Again, as can be seen by comparing FIG. 9 and FIG. 3, the read margin between data states ST1 and ST2 is increased. Similarly, for a threshold voltage distribution corresponding to state ST3, memory cells between verify voltages Vvyf31 and Vvfy32 (or read and verify voltages Vread3 and Vvfy32) are programmed to have the verify voltage Vvfy32 or a voltage higher than the verify voltage Vvfy32. Here again, read margin between data states ST2 and ST3 is increased.

Figure 3:
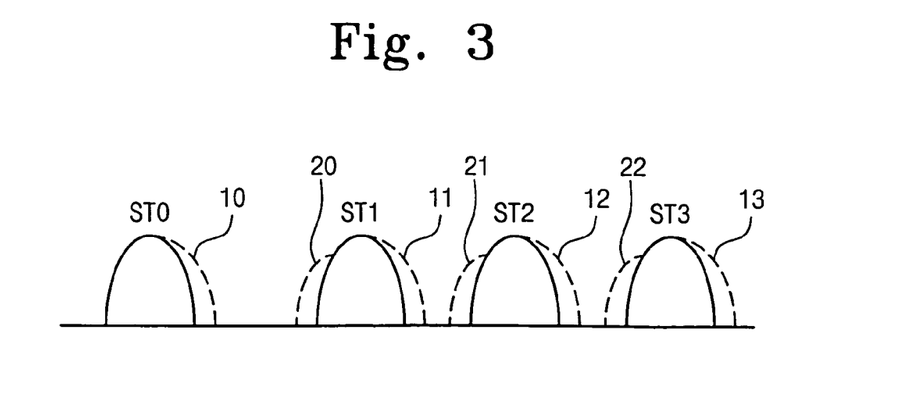
FIG. 3 illustrates expanded threshold voltage distributions caused by high temperature stress (HTS).

Thus, read margins between adjacent data states are markedly increased over read margins characterizing conventional memory cells, as illustrated in FIG. 3. Thus, even under the influence of expanded threshold voltage distributions due to electric field and/or F-poly coupling effects and HTS, read margin between adjacent data states may be sufficiently secured using the programming method according to embodiments of the invention.

Figure 11A:
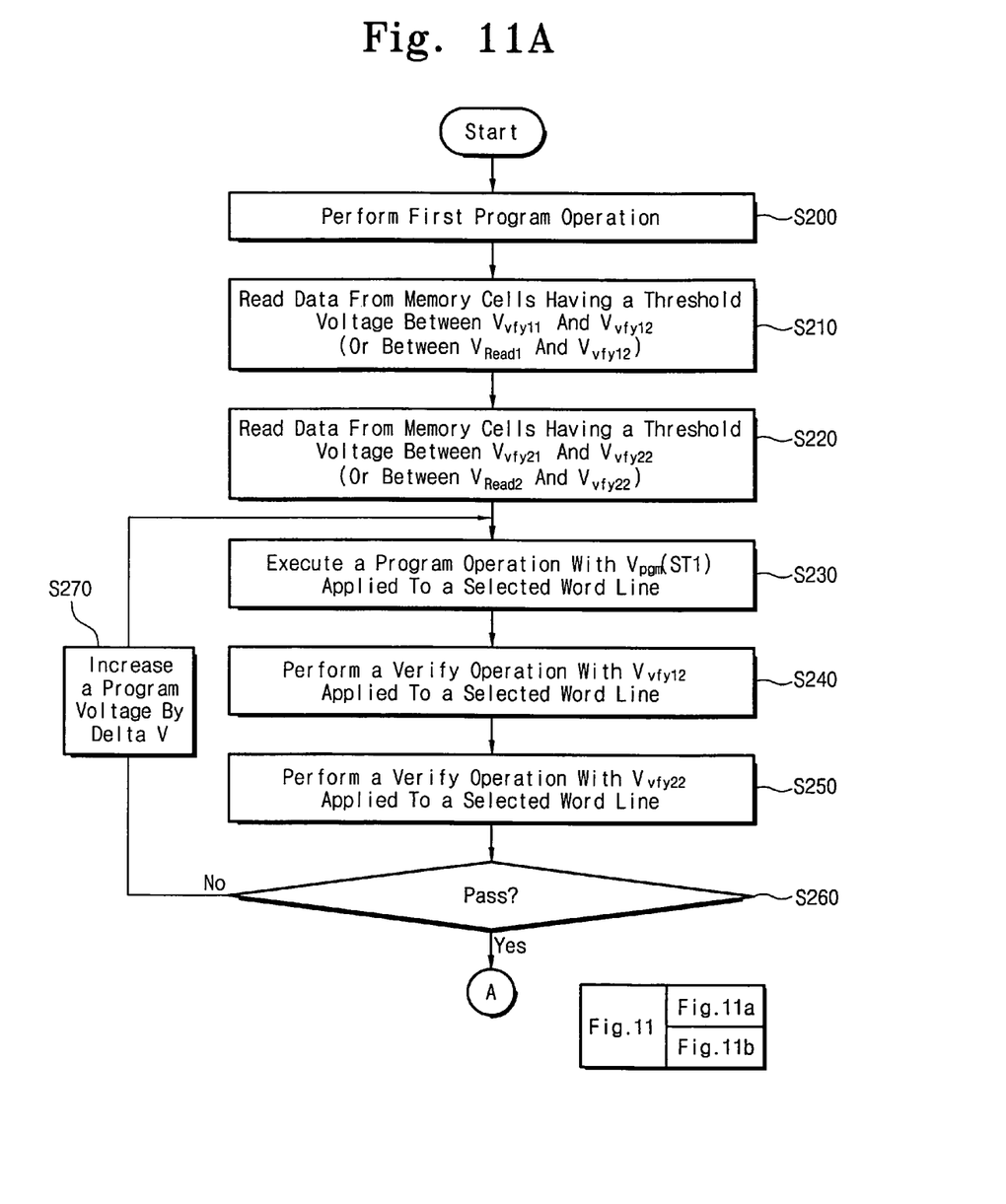
FIGS. 11A, 11B, 12A, and 12B are flowcharts illustrating exemplary programming methods for a flash memory device according to various embodiments of the invention.
Figure 11B:
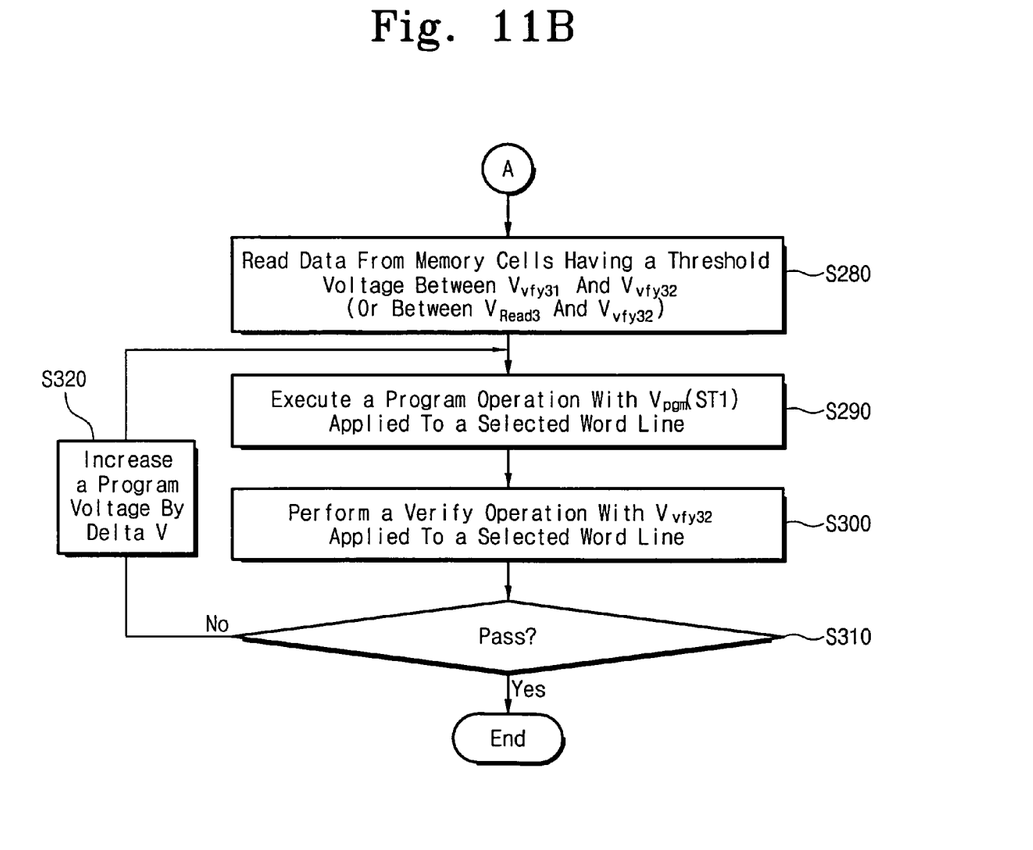

FIG. 11, comprising collectively FIGS. 11A and 11B, is a flowchart illustrating a programming method for a flash memory device according to another embodiment of the invention.

The primary programming operation described with reference to FIGS. 6A and 6B is first executed (S200). During the primary programming operation, memory cells of a selected page are programmed to one of states ST1, ST2, and ST3, as shown in FIG. 8. This is determined based on verify voltages Vvfy11, Vvfy21, and Vvfy31 corresponding to states ST1, ST2, and ST3. For example, verify voltage Vvfy11 is used to determine whether a memory cell is programmed to state ST1; verify voltage Vvfy21 is used to determine whether a memory cell is programmed to state ST2; and verify Vvfy31 is used to determine whether a memory cell is programmed to state ST3.

Once the primary programming operation for 2-bit data is completed, memory cells arranged within a specific region are selected among threshold voltage distributions each corresponding to states ST1, ST2, and ST3. More specifically, data is read from memory cells having a threshold voltage between the verify voltages Vvfy11 and Vvfy12 (or a read voltage Vread1 and the verify voltage Vvfy12), as shown in FIG. 8 (S210). This may be done by executing a read operation through register block 120 while the verify voltage Vvfy11 (or the read voltage Vread1) is applied to a selected wordline and executing a read operation through register block 120 while the verify voltage Vvfy12 is applied to the selected wordline.

Data is also read from memory cells having a threshold voltage between the verify voltages Vvfy21 and Vvfy22 (or a read voltage Vread2 and the verify voltage Vvfy22), as shown in FIG. 8 (S220). This may be done by executing a read operation through register block 120 while the verify voltage Vvfy21 (or the read voltage Vread2) is applied to a selected wordline and executing a read operation through register block 120 while the verify voltage Vvfy22 is applied to the selected wordline. It will be understood by those skilled in the art that methods of detecting memory cells having threshold voltages between verify voltages each corresponding to the states ST1, ST2, and ST3 may vary with the configuration of register block 120.

If memory cells having threshold voltages arranged within a specific region of threshold voltages each corresponding to the states ST1 and ST2 are detected, another programming operation (i.e., a secondary programming operation) is executed simultaneously for the detected memory cells (S230). At this point, a program voltage is applied to a wordline when state ST1 is to be programmed. As described above, although a low program voltage is applied to a selected wordline, a threshold voltage increases with increase in the program voltage, as illustrated in FIG. 10. In other words, although a low program voltage is applied to a selected wordline, charge is injected into the floating gate of a memory cell.

After the programming operation is completed, verify read operations are successively executed to determine whether the detected memory cells having states ST1 and ST2 are programmed with corresponding verify voltages or a voltage higher than the verify voltages. More specifically, a verify read operation is executed through register block 120 while the verify voltage Vvfy11, acting as a read voltage, is applied to a selected wordline (S240). A verify read operation is executed through register block 120 while the verify voltage Vvfy22, acting as a read voltage, is applied to a selected wordline (S250). It is then determined whether the detected memory cells are correctly programmed (S260). If the determination indicates that all the detected memory cells are not correctly programmed with a required threshold voltage, the program voltage applied to the selected wordline may be increased by a predetermined increment (S270). In the illustrated example, the method returns to step S230. The programming loop, comprising the S230-270, is repeated for a predetermined number of iterations or until all the memory cells are properly programmed.

If the determination result indicates that the detected memory cells are programmed with the required threshold voltage, memory cells arranged within a specific region of a threshold voltage distribution corresponding to the state ST3 are selected (S280). This may be done by executing a read operation through register block 120 while the verify voltage Vvfy31 (or the read voltage Vread3) is applied to a selected wordline and executing a read operation through register block 120 while a verify voltage Vvfy32 higher than the verify voltage Vvfy31 is applied to a selected wordline. Memory cells having threshold voltages between the verify voltages Vvfy31 and Vvfy32 (or the read voltage Vread3 and the verify voltage Vvfy32) are detected through the read operations twice executed. If the memory cells having threshold voltages between the verify voltages Vvfy31 and Vvfy32 (or the read voltage Vread3 and the verify voltage Vvfy32) are detected, the secondary programming operation is executed for the detected memory cells (S290). At this point, a program voltage is applied to a wordline when state ST1 is to be programmed. After the programming operation is executed, a verify read operation is executed while the verify voltage Vvfy32, acting as a read voltage, is applied to a selected wordline (S300). It is determined whether the detected memory cells are programmed to have a threshold voltage corresponding to the verify voltage Vvfy32 (S310). If the determination result indicates that all the detected memory cells are not programmed with a required threshold voltage, the program voltage applied to the selected wordline is increased by a predetermined increment (S320). In the illustrated example, the method routine returns to step S290. The programming loop, comprising steps S290-320 may be repeated for a predetermined number of iterations or until all the detected memory cells are properly programmed. Once the determination result indicates that all the detected memory cells are programmed with the required threshold voltage, the programming operation may be ended.

Figure 12A:
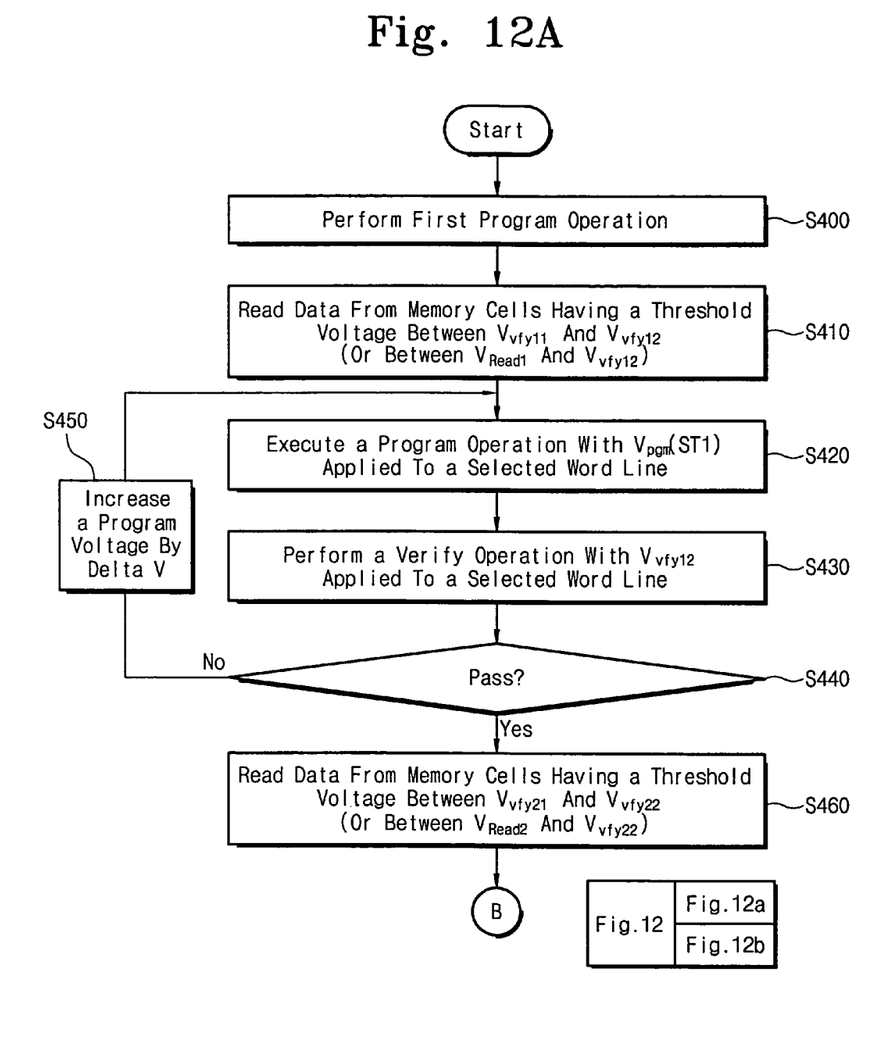
Figure 12B:
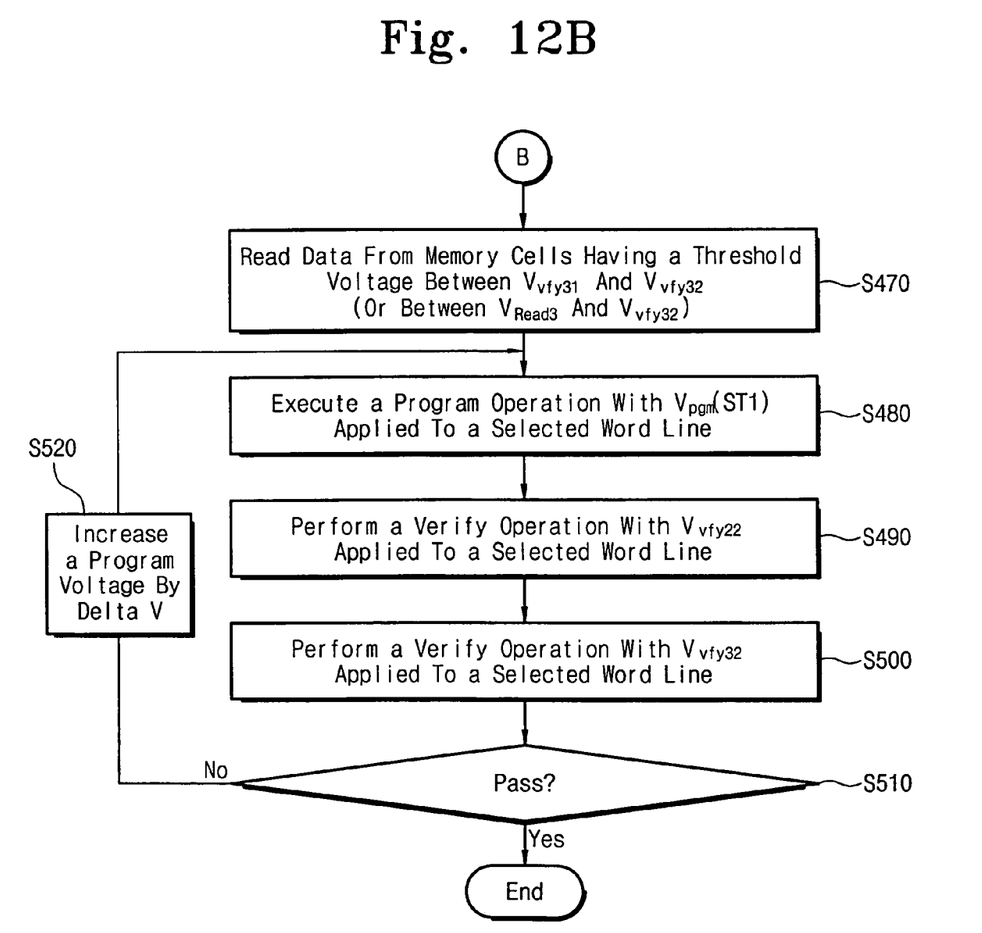

FIG. 12, collectively comprising FIGS. 12A and 12B, is a flowchart illustrating a programming method for a flash memory device according to still another embodiment of the invention.

The primary programming operation described with reference to FIGS. 6A and 6B is first executed (S400). During the primary programming operation, memory cells of a selected page are programmed to one of states ST1, ST2, and ST3, as shown in FIG. 8. This is determined based on verify voltages Vvfy11, Vvfy21, and Vvfy31 corresponding to states ST1, ST2, and ST3. For example, verify voltage Vvfy11 is used to determine whether a memory cell is programmed to state ST1; verify voltage Vvfy21 is used to determine whether a memory cell is programmed to state ST2; and verify Vvfy31 is used to determine whether a memory cell is programmed to state ST3.

Once the primary programming operation for 2-bit data is complete, data is read from memory cells having a threshold voltage between verify voltages Vvfy11 and Vvfy12 (or a read voltage Vread1 and the verify voltage Vvfy12) shown in FIG. 8 (S410). This may be done by executing a read operation through register block 120 while the verify voltage Vvfy11 (or the read voltage Vread1) is applied to a selected wordline and executing a read operation through register block 120 while the verify voltage Vvfy12 is applied to a selected wordline. Memory cells having threshold voltages between the verify voltages Vvfy11 and Vvfy12 (or the read voltage Vread1 and the verify voltage Vvfy12) are detected through the read operations twice executed. It will be understood by those skilled in the art that method of detecting memory cells having threshold voltages between the verify voltages Vvfy1 and Vvfy12 may vary with the configuration of register block 120.

If the memory cells having threshold voltages between the verify voltages Vvfy11 and Vvfy12 (or the read voltage Vread1 and the verify voltage Vvfy12) are detected, another programming operation (i.e., a secondary programming operation) is performed simultaneously for the detected memory cells (S420). After the programming operation is executed, a verify read operation is used while the verify voltage Vvfy12 acting as a read voltage is applied to a selected wordline (S430). Next, it is determined whether the detected memory cells are programmed to have a threshold voltage corresponding to the verify voltage Vvfy12 (S440). If the determination result indicates that all the detected memory cells are not properly programmed with a required threshold voltage, a program voltage is applied to a selected wordline may be increased by a predetermine increment (S450). In the illustrated example, the method then returns to step S420. The programming loop, collectively comprising steps S420-S450, is repeated for a predetermined number of iterations or until the detected memory cells are all properly programmed.

If the determination result indicates that all the detected memory cells are programmed with a required threshold voltage, memory cells arranged within a specific region of threshold voltage distributions each corresponding to the states ST2 and ST3 are selected. More specifically, data is read from memory cells having a threshold voltage between the verify voltages Vvfy21 and Vvfy22 (or the read voltage Vread2 and the verify voltage Vvfy22), as shown in FIG. 8 (S460). This may be done by executing a read operation through register block 120 while the verify voltage Vvfy21 (or the read voltage Vread2) is applied to a selected wordline and executing a read operation through register block 120 while the verify voltage Vvfy22 is applied to a selected wordline. Next, data is read from memory cells having a threshold voltage between the verify voltages Vvfy31 and Vvfy32 (or the read voltage Vread3 and the verify voltage Vvfy32) shown in FIG. 8 (S470). This may be done by executing a read operation through register block 120 while the verify voltage Vvfy31 (or the read voltage Vread3) is applied to a selected wordline and executing a read operation through the register block 120 while the verify voltage Vvfy32 is applied to a selected wordline.

If memory cells having threshold voltage arranged within specific regions of threshold voltages each corresponding to states ST2 and ST3 are detected, the secondary programming operation is executed simultaneously for the detected memory cells (S480). At this point, a program voltage is applied to a wordline when state ST1 is programmed. As described above, although a low program voltage is applied to a selected wordline, a threshold voltage increases with the increase of the program voltage, as illustrated in FIG. 10. In other words, although a low program voltage is applied to a selected wordline, charge is injected into the floating gate of a memory cell.

After the programming operation is executed, verify read operations are successively executed to determine whether the detected memory cells of the states ST2 and ST3 are programmed with corresponding verify voltages or a voltage higher than the verify voltages. More specifically, a verify read operation is executed while a verify voltage Vvfy22, acting as a read voltage, is applied to a selected wordline (S490). Next, a verify read operation is executed while a verify voltage Vvfy32, acting as a read voltage, is applied to a selected wordline (S500). It is determined whether the detected memory cells are correctly programmed (S510). If the determination result indicates that all the detected memory cells are not programmed with a required threshold voltage, the program voltage applied to a selected wordline may be increased by a predetermined increment (S520). In the illustrated example, the method returns to step S480. Thus, the programming loop, collectively comprising steps S480-S520, may be repeated for a predetermined number of iterations or until the detected memory cells are all properly programmed. If the determination result indicates that all the detected memory cells are programmed with the required threshold voltage, the programming operation may be ended.

The read voltages required for reading data from memory cells programmed according to an embodiment of the present invention may be set to be identical to the read voltages used to execute the primary programming operation. A flash memory device according to an embodiment of the invention may be adapted to the use of an incremental step pulse programming (ISPP) scheme where a program voltage increases gradually by a predetermined increment as programming loops are repeated.

According to the illustrated embodiments of the invention, after being subjected to a primary programming operation, memory cells arranged within a specific region of a voltage distribution corresponding to a respective state may be subjected to a secondary programming operation characterized by a threshold voltage equivalent to or higher than a verify voltage of the primary programming operation. Thus, the memory cells may be suffering under the influence of an expanded threshold voltage distribution due to electric field and/or F-poly coupling effects and HTS, read margins between adjacent data states may be sufficiently secured using a programming method according to embodiments of the invention.

Although the present invention has been described in connection with several embodiments illustrated in the accompanying drawings, it is not limited thereto. It will be apparent to those skilled in the art that various substitution, modifications and changes may be thereto without departing from the scope of the invention as defined by the flowing claims.

What is claimed is:

1. A programming method for a flash memory device having a plurality of memory cells storing multi-bit data indicating one of a plurality of states, the programming method comprising:
    programming selected memory cells with multi-bit data to have one of the plurality of states using a first programming operation;
    following programming of the selected memory cells with multi-bit data using the first programming operation, detecting programmed memory cells arranged within a predetermined region of a threshold voltage distribution, the region corresponding to at least two of the plurality of states, wherein predetermined regions of the respective at least two of the plurality of states are selected by one of a first verify voltage and a read voltage and a second verify voltage, the first verify voltage being lower than the second verify voltage and higher than the read voltage; and
    following detection of the programmed memory cells and using a second programming operation, simultaneously programming detected memory cells of the at least two of the plurality of states to have a threshold voltage equivalent to or higher than the second verify voltage corresponding to each of the plurality of states.

2. The programming method as recited in claim 1, wherein the plurality of states comprises a first state corresponding to an erased state for a memory cell and second, third and fourth states corresponding to different programmed states for a memory cell.

3. The programming method as recited in claim 1, wherein simultaneously programming the detected memory cells using the second programming operation comprises repeatedly applying a program voltage to a wordline associated with the detected memory cells in a programming loop that gradually increases with each iteration of the programming loop.

4. The programming method as recited in claim 1, wherein the first verify voltage is used to determine whether the selected memory cells are programmed with the multi-bit data.

5. A programming method for a flash memory device having a plurality of memory cells storing multi-bit data indicating one of at least four data states, the programming method comprising:
    programming selected memory cells using multi-bit data to have one of second through fourth states using a first programming operation;
    after programming of the selected memory cells using the first programming operation, detecting programmed memory cells, wherein detecting programmed memory cells comprises:
        detecting programmed memory cells arranged within a predetermined region of a threshold voltage distribution corresponding to the second state, wherein the predetermined region of the second state is defined in relation to one of a first verify voltage and a first read voltage and a second verify voltage, the first verify voltage being lower than the second verify voltage and higher than the first read voltage;
        detecting programmed memory cells arranged within a predetermined region of a threshold voltage distribution corresponding to the third state, wherein the predetermined region of the third state is defined in relation to one of a third verify voltage and a second read voltage and a fourth verify voltage, the third verify voltage being lower than the fourth verify voltage and higher than the second read voltage; and
    after detecting programmed memory cells, simultaneously programming the detected memory cells of the second state and the detected memory cells of the third state to have a threshold voltage equivalent to or higher than the second and fourth verify voltages, respectively.

6. The programming method as recited in claim 5, wherein the at least four data states include an erase state associated with a lowest predetermined region of the threshold voltage distribution less than the respective predetermined regions of the threshold voltage distribution corresponding to the second and third states, and
    simultaneously programming the detected memory cells of the second state and the detected memory cells of the third state comprises, applying a program voltage to a selected wordline, wherein the program voltage is used to program selected memory cells to the erase state during the first programming operation.

7. The programming method as recited in claim 6 wherein the program voltage increases gradually with repetition of a programming loop.

8. The programming method as recited in claim 6 wherein detecting programmed memory cells further comprises:

detecting programmed memory cells arranged within a predetermined region of a threshold voltage corresponding to the fourth state, wherein the predetermined region of the fourth state is defined in relation to one of a fifth verify voltage and a third read voltage and a sixth verify voltage, the fifth verify voltage being lower than the sixth verify voltage and higher than the third read voltage; and simultaneously programming memory cells further comprises programming the detected memory cells of the fourth state to have a threshold voltage equivalent to or higher than the sixth verify voltage.

9. The programming method as recited in claim 5, wherein the first state indicates an erased state, and the second to fourth states indicate programmed states.

10. The programming method as recited in claim 8, wherein the first, third, and fifth verify voltages are used to determine whether the selected memory cells are programmed using multi-bit data.

11. A programming method for a flash memory device having a plurality of memory cells for storing multi-bit data indicating one of first through fourth data states, the programming method comprising:

programming selected memory cells using multi-bit data to have one of the second through fourth states using a first programming operation;

after programming of the selected memory cells using the first programming operation, detecting programmed memory cells, wherein detecting programmed memory cells comprises:

detecting programmed memory cells arranged within a predetermined region of a threshold voltage corresponding to the second state, wherein the predetermined region of the second state is selected by one of a first verify voltage and a first read voltage, and a second verify voltage, the first verify voltage being lower than the second verify voltage and higher than the first read voltage;

detecting programmed memory cells arranged within a predetermined region of a threshold voltage distribution corresponding to the third state, wherein the predetermined region of the third state is selected by one of a third verify voltage and a second read voltage, and a fourth verify voltage, the third verify voltage being lower than the fourth verify voltage and higher than the second read voltage;

detecting programmed memory cells arranged within a predetermined region of a threshold voltage corresponding to the fourth state, wherein the predetermined region of the fourth state is selected by one of a fifth verify voltage and a third read voltage, and a sixth verify voltage, the fifth verify voltage being lower than the sixth verify voltage and higher than the third read voltage; and after detecting the programmed memory cells, simultaneously programming the detected memory cells of the second state, the detected memory cells of the third state, and the detected memory cells of the fourth state to respectively have a threshold voltage equivalent to or higher than the second, fourth, and sixth verify voltages.

12. The programming method as recited in claim 11 wherein when the detected memory cells are programmed simultaneously, a program voltage applied to a selected wordline is a lowest program voltage used to program the multi-bit data during the first programming operation.

13. The programming method as recited in claim 12, wherein the program voltage increases gradually with the repetition of a programming loop.

14. The programming method as recited in claim 11 wherein the first, third, and fifth verify voltages are used to determine whether the selected memory cells are programmed using multi-bit data.

15. A programming method for a flash memory device having a plurality of memory cells storing multi-bit data indicating an erased state or one of a plurality of programmed states, the programming method comprising:

programming selected memory cells with multi-bit data to have one of the plurality of programmed states;

detecting programmed memory cells arranged within a predetermined region of a threshold voltage distribution, the predetermined region corresponding to at least first and second states of the plurality of programmed states, wherein a first portion of the predetermined region corresponding to the first state is defined in relation to a first verify voltage, a first read voltage and a second verify voltage, the first verify voltage being lower than the second verify voltage and higher than the first read voltage, and a second portion of the predetermined region corresponding to the second state is defined in relation to a third verify voltage, a second read voltage and a fourth verify voltage, the third verify voltage being lower than the fourth verify voltage and higher than the second read voltage; and following detection of the programmed memory cells, simultaneously programming the detected memory cells of first state to have a threshold voltage greater than or equal to the second verify voltage, and the detected memory cells of second state to have a threshold voltage greater than or equal to the fourth verify voltage.

16. The programming method as recited in claim 15 wherein detecting the programmed memory cells arranged within a predetermined region of a threshold voltage distribution comprises:

performing a first read operation on the programmed memory cells in relation to a first voltage ranging between either the first verify voltage and the second verify voltage, or between the first read voltage and the second verify voltage; and performing a second read operation on the programmed memory cells in relation to a second voltage ranging between either the third verify voltage and the fourth verify voltage, or between the second read voltage and the fourth verify voltage.

17. The programming method as recited in claim 16 further comprising after the simultaneous programming of the detected memory cells:

performing a first verify operation by applying the second verify voltage to a selected word line associated with the detected memory cells; and performing a second verify operation by applying the fourth verify voltage to the selected wordline.

18. The programming method as recited in claim 17 wherein simultaneously programming the detected memory cells comprises:

applying a program voltage to the selected wordline associated with the detected memory cells that is lower than any program voltage applied during the programming of the selected memory cells with the multi-bit data.

19. The programming method as recited in claim 18 further comprising: upon determining from the first and second verify operations that the detected memory cells are not properly programmed, incrementing the program voltage applied to the selected wordline and again simultaneously programming the detected memory cells.

* * * * *